United States Patent [19]
Bindal

[11] Patent Number: 5,548,148
[45] Date of Patent: Aug. 20, 1996

[54] MOS CHANNEL DEVICE WITH COUNTERDOPING OF ION IMPLANT FOR REDUCED SUBSTRATE SENSITIVITY

[75] Inventor: Ahmet Bindal, Rochester, Minn.

[73] Assignee: International Business Machines Corporation, Armonk, N.Y.

[21] Appl. No.: 537,258

[22] Filed: Sep. 29, 1995

Related U.S. Application Data

[63] Continuation of Ser. No. 228,563, Apr. 15, 1994, abandoned.

[51] Int. Cl.$^6$ .................................................. H01L 29/76
[52] U.S. Cl. ..................... 257/335; 257/345; 257/376; 257/402; 257/403; 257/590; 257/657; 257/917
[58] Field of Search .............................................. 257/330

[56] References Cited

U.S. PATENT DOCUMENTS

| | | | |
|---|---|---|---|
| 4,027,380 | 6/1977 | Deal et al. | 257/655 |
| 4,108,686 | 8/1978 | Jacobus, Jr. | |
| 4,521,796 | 6/1985 | Rajkanan et al. | |
| 5,073,509 | 12/1991 | Lee | |
| 5,091,324 | 2/1992 | Hsu et al. | |
| 5,141,882 | 8/1992 | Komori et al. | |

FOREIGN PATENT DOCUMENTS

| | | |
|---|---|---|
| 222731 | 4/1984 | Germany . |
| 61-214457 | 9/1986 | Japan . |
| 2089566 | 12/1980 | United Kingdom . |

OTHER PUBLICATIONS

Carlson et al., "Reduced Substrate Sensitivity in Field-Effect Transistors," IBM Technical Disc. Bulletin, vol. 16, No. 3, pp. 1022–1023, Aug. 1973.

Dally et al., "Sub–Micron Channel Length CMOS Technology," IBM Technical Disclosure Bulletin, vol. 33, No. 4, pp. 227–232, Sep. 1990.

Chao et al., "Fabrication Procedure for MOSFET Logic Integrated Circuit with Very Thin Gate Oxide." IBM Technical Disclosure Bulletin, vol. 22, No. 11, pp. 5152–5123, Apr. 1980.

*Primary Examiner*—Edward Wojciechowicz
*Attorney, Agent, or Firm*—Joan Pennington; J. Michael Anglin

[57] ABSTRACT

An N-channel and P-channel MOSFET include counterdoping of a threshold voltage ($V_T$) ion implant for reducing substrate sensitivity and source/drain junction capacitance. An arsenic (As) compensated boron (B) implant is provided in the N-channel MOSFET. A boron (B) compensated arsenic (As) implant is provided in the P-channel MOSFET.

15 Claims, 8 Drawing Sheets

NO As-COUNTERDOPING

WITH As-COUNTERDOPING

MOS CHANNEL DEVICE WITH COUNTERDOPING OF ION IMPLANT FOR REDUCED SUBSTRATE SENSITIVITY

This application is a continuation of application Ser. No. 08/228,563 filed Apr. 15, 1994, now abandoned.

BACKGROUND OF THE INVENTION

1. Field of the Invention

The present invention relates to a semiconductor integrated circuit device, and more particularly to an N-channel and a P-channel metal oxide semiconductor field effect transistor MOSFET.

2. Description of the Prior Art

N(P)-channel metal oxide semiconductor field effect transistors (MOSFETS) used in the dynamic random access memory (DRAM) technology must have very low OFF (standby) current to reduce the power consumption of the entire memory chip.

One of the ways to design a MOSFET with low OFF current is to use a high dose threshold voltage ($V_T$) boron (arsenic) implant for the channel of the transistor. This high dose boron (arsenic) implant in the channel effectively increases the potential barrier between the channel and the drain and thereby decreases the standby current of the device with a gate to source voltage $V_{GS}=0$ volts and the drain to source voltage $V_{DS}=2.5$ or 3.6 volts depending on the voltage supply for the particular technology. However, a problem with the boron (arsenic) implant is substrate sensitivity due to the implant tail. Substrate sensitivity is defined as the rate of increase in threshold voltage, $V_T$, due to the increase in source to substrate voltage, $V_{SX}$. In other words, substrate sensitivity=$\Delta V_T/\Delta V_{SX}$. High substrate sensitivity is a very undesirable feature for any CMOS technology, because this element decreases the current drive capability of an N(P)-channel MOSFET.

SUMMARY OF THE INVENTION

An object of the present invention is to provide a semiconductor device, such as an N(P)-channel metal oxide semiconductor field effect transistor (MOSFET) having low substrate sensitivity and also low junction capacitance for circuit performance.

In brief, the objects and advantages of the present invention are achieved by an N-channel and P-channel MOSFETs including counterdoping of a threshold voltage $V_T$-ion implant for reducing substrate sensitivity and source/drain junction capacitance. An arsenic (As) compensated boron implant is provided in the N-channel MOSFET. A boron (B) compensated arsenic implant is provided in the P-channel MOSFET.

BRIEF DESCRIPTION OF THE DRAWING

The present invention, together with the above and other objects and advantages, can best be understood from the following detailed description of the embodiment of the invention illustrated in the drawing, wherein.

DETAILED DESCRIPTION OF THE PREFERRED EMBODIMENTS

Figure 1:
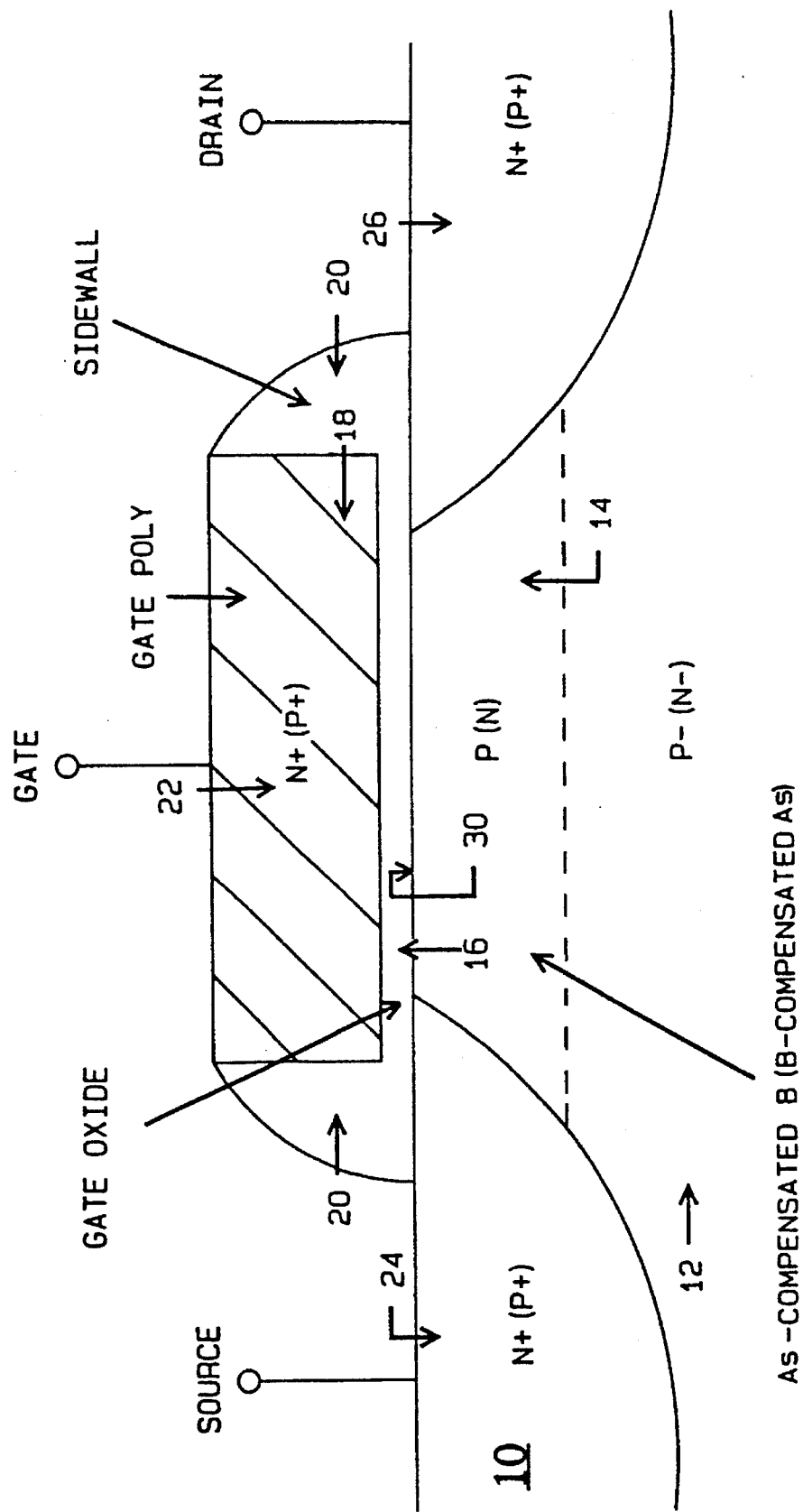
FIG. 1 is an enlarged side view of a portion of a N(P) channel semiconductor device in accordance with the present invention.

Referring now to the drawing, in FIG. 1 there is illustrated a portion of an N(P)-channel semiconductor device or structure according to the invention generally designated by the reference numeral 10. For an N-channel device, the semiconductor device 10 defining the metal oxide semiconductor field effect transistor MOSFET includes a p- type substrate 12, a boron p type implant 14, a gate oxide layer 16, a polysilicon layer 18, opposed sidewalls 20, an arsenic (n+) implant forms the gate 22, source 24 and drain 26. For a P-channel device, n-, n and p+ type regions are shown in parenthesis following the region designations for the N channel in FIG. 1.

Figure 2:
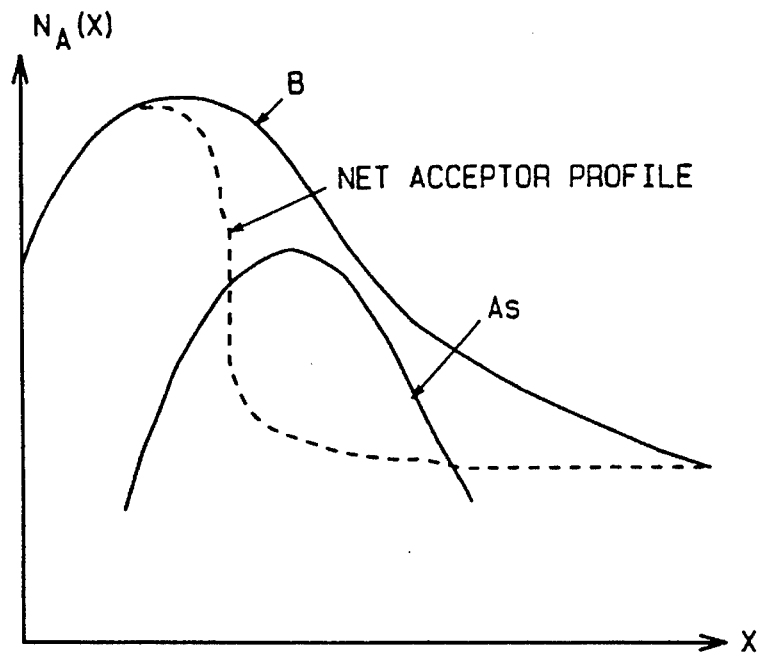
FIG. 2 is a doping profile of the N-channel semiconductor device of the present invention illustrated in FIG. 1.

In accordance with the present invention, to prevent high substrate sensitivity, the boron implant 14 is compensated or counterdoped with arsenic As to neutralize a tail portion of the channel boron implant 14 at a deeper level. As shown in FIG. 2, the As co-implantation sharpens the B-profile in such a way that the N-channel MOSFET provides a high threshold voltage $V_T$ to have a small standby current, while avoiding high substrate sensitivity. For the P-channel device, the arsenic n type implant 14 is compensated or counterdoped with boron B to prevent high substrate sensitivity.

Referring also to FIG. 2, a doping profile for the semiconductor device 10 illustrates active acceptor density $N_A(X)$, as a function of depth X below a gate oxide/substrate interface 30 shown in FIG. 1. The curve labelled B shows the boron implant without As-counter-doping. The curve labelled As represents the arsenic implant. The curve labelled NET ACCEPTOR PROFILE illustrates the compensated boron profile with the As implant counterdoping. For the P-channel device, a net donor profile with arsenic (As) compensated or counterdoped with boron (B) replaces the curve NET ACCEPTOR PROFILE, arsenic replaces the curve B, and boron replaces the curve As.

Figure 3A:
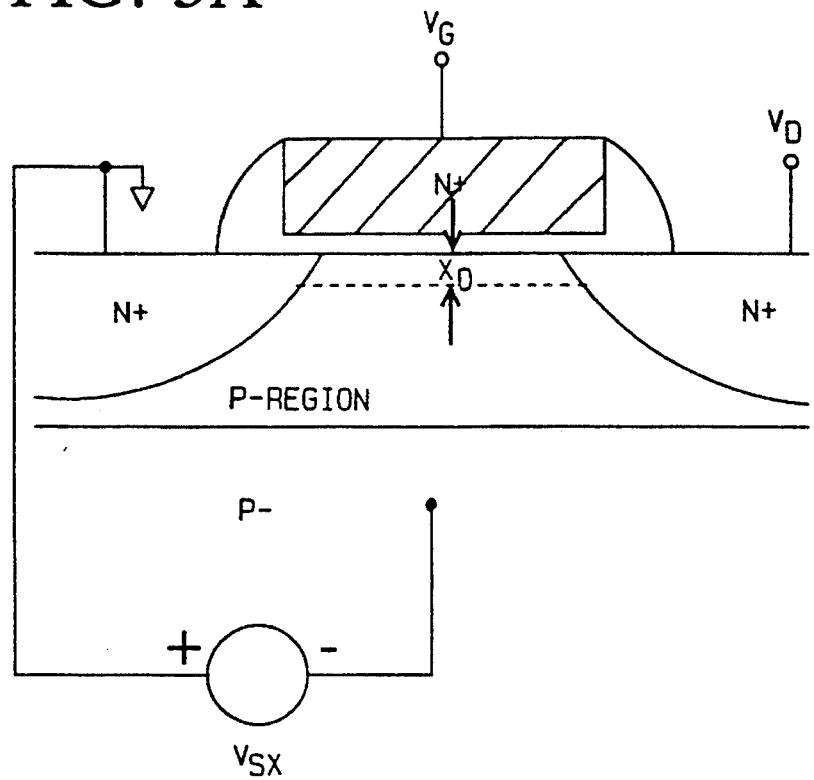
FIG. 3A is a schematic and cross-sectional representation of an N-channel semiconductor device without arsenic counterdoping.
Figure 3B:
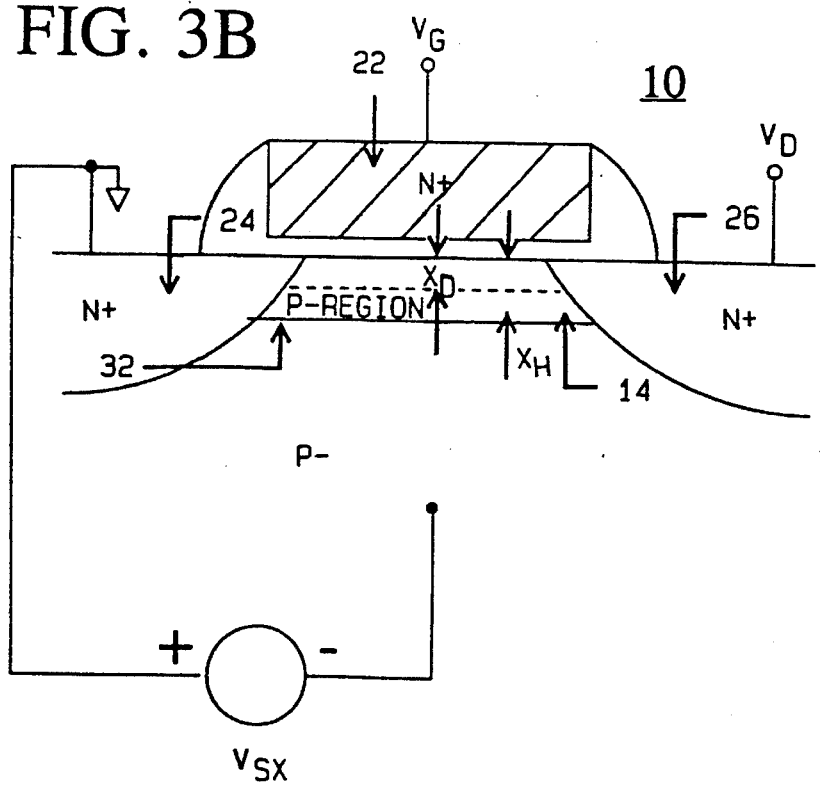
FIG. 3B is a schematic and cross-sectional representation of the N-channel semiconductor device with arsenic counterdoping.

Referring to FIGS. 3A, 3B, the operation of the As-counterdoping of the boron implant 14 (and the B counterdoping of arsenic) providing decreased substrate sensitivity may be understood as follows. Low substrate sensitivity keeps the current drivability of the MOSFET high.

A threshold voltage ($V_T$) for the n-channel enhancement mode MOSFET can be represented by:

$$V_T = V_{FB} + \beta_S + Q_{DEP}/C_{OX} \quad (1)$$

where $V_{FB}$ is the flatband voltage, $\beta_S$ is the semiconductor surface potential, $Q_{DEP}$ is the depletion region charge and $C_{OX}$ is the gate oxide capacitance. The depletion region charge $Q_{DEP}$ can be defined by:

$$Q_{DEP} = qNX_D \quad (2)$$

where q represents coulomb charge of $1.6*10^{-19}$ coulombs, N represents active acceptor (donor) atoms and $X_D$ represents a depletion region height between the oxide-semiconductor interface 30 and the height of the P-region ($X_H$) as shown in FIG. 3B.

Comparing the device without As-counterdoping of FIG. 3A with the device with As-counterdoping of FIG. 3B, the As-counterdoping makes p/p- boundary 32 sharper. The resulting sharp boundary 32 produces the reduced substrate sensitivity and also lowers the junction capacitance of the source and drain.

The depletion region height $X_D$ and current $I_D$ during saturation can be defined by:

$$X_D = \frac{\sqrt{2\epsilon_S(V_{SX} + \beta_S)}}{\sqrt{qN}} \quad (3)$$

$$I_D = K(V_G - V_T)^2 \quad (4)$$

As $V_{SX}$ is increased, $X_D$ will increase according to the above Equation 3. The depletion region charge, $Q_{DEP}$, will increase according to the above Equation 2. $V_T$ will increase due to the above Equation 1, $(V_G - V_T)$ will decrease for a given gate voltage, for example, $V_G = 2.5$ volts and $I_D$ will decrease as a result of the above Equation 4.

Therefore, if $0 < X_D < X_H \rightarrow N = N_A = p$, then $$Q_{DEP} = qN_A X_D, X_D = \frac{\sqrt{2\epsilon_S(V_{SX} + \beta_S)}}{\sqrt{qN_A}}$$

$$Q_{DEP} = \sqrt{2\epsilon_S qN_A(V_{SX} + \beta_S)} \quad (5)$$

$$V_T = V_{FB} + \beta_S + \frac{\sqrt{2\epsilon_S qN_A(V_{SX} + \beta_S)}}{C_{OX}} \quad (6)$$

Figure 4:
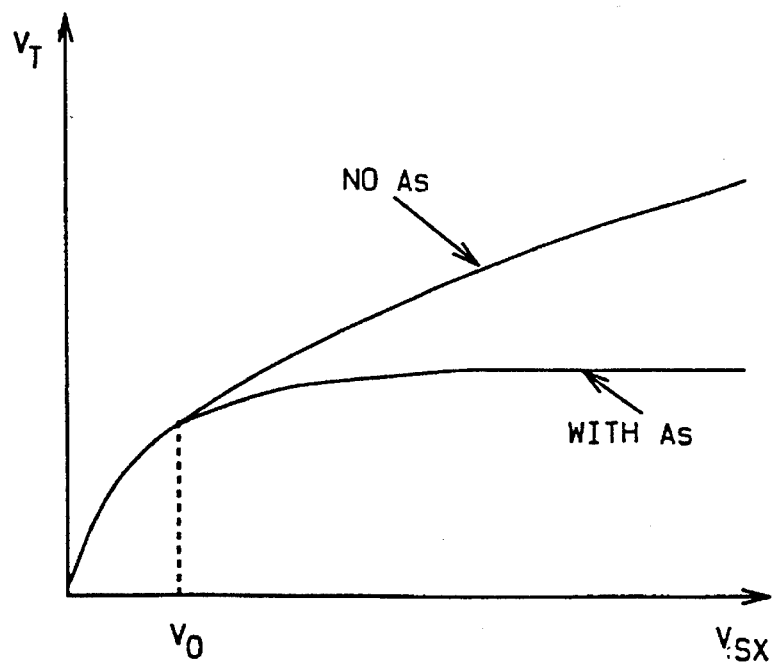
FIG. 4 is a graph illustrating threshold voltage relative to source-substrate voltage for the semiconductor device with and without arsenic counterdoping.

Referring to FIG. 4, there is shown a graph illustrating threshold voltage $V_T$ relative to source to substrate voltage, $V_{SX}$. A curve labelled NO As represents the semiconductor device without arsenic counterdoping of FIG. 3A and a curve labelled WITH As represents the semiconductor device 10 of the present invention illustrated in FIG. 3B. As shown in FIG. 4 where $V_{SX} = V_O$, $V_O$ indicated where $X_D = X_H$.

In MOSFET with As-counterdoping, if $X_D > X_H \rightarrow N = N_S = p - \ll N_A$ $$V_T = V_{FB} + \beta_S + V_O + \frac{\sqrt{2\epsilon_S qN_S(V_{SX} + \beta_S)}}{C_{OX}} \approx V_{FB} + \beta_S + V_O.$$

Whereas MOSFET with no As-counterdoping, if $X_D > X_H \rightarrow N = N_A = p$ $$V_T = V_{FB} + \beta_S + V_O + \frac{\sqrt{2\epsilon_S qN_A(V_{SX} + \beta_S)}}{C_{OX}}$$

Thus, $I_D = K(V_G - V_{FB} - \beta_S - V_O)^2$ stays high in MOSFET with As-counterdoping.

For the MOSFET without As-counterdoping, the current $I_D$ is defined by:

$$I_D = K\left[V_G - V_{FB} - \beta_S - V_O - \frac{\sqrt{2\epsilon_S qN_A(V_{SX} + \beta_S)}}{C_{OX}}\right]^2$$

This current, $I_D$ keeps decreasing with increasing $V_{SX}$.

Figure 5A:
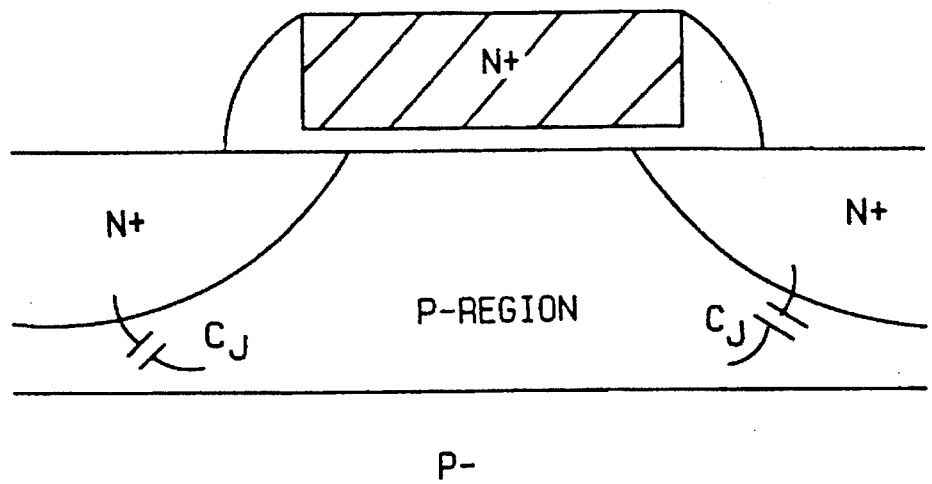
FIG. 5A is a schematic and cross-sectional representation illustrating junction capacitance of an N-channel semiconductor device without arsenic counterdoping.
Figure 5B:
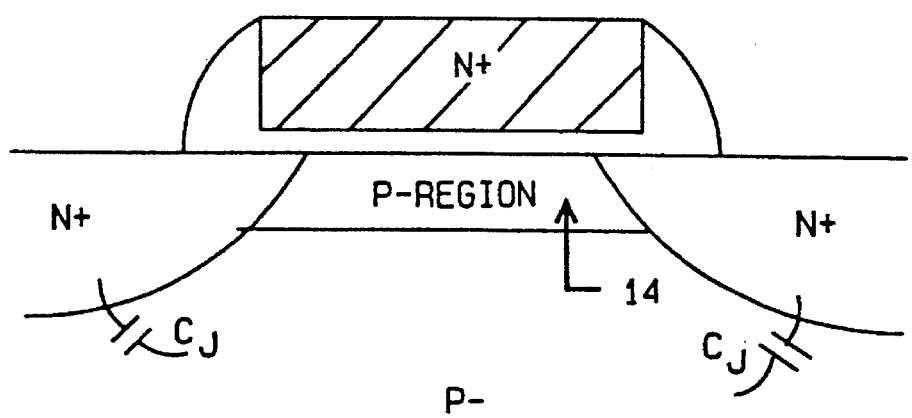
FIG. 5B is a schematic and cross-sectional representation illustrating junction capacitance of an N-channel semiconductor device with arsenic counterdoping as illustrated in FIG. 1.

Referring to FIGS. 5A and 5B, junction capacitance $C_J$ of a semiconductor device without arsenic counterdoping and of the semiconductor device 10 with arsenic counterdoping is illustrated. The operation of the As-counterdoping of the boron implant 14 to keep the S/D junction capacitance low may be understood as follows.

Junction capacitance $C_J$ can be defined by:

$$C_J = \frac{\epsilon_S}{X_S}, X_S = \frac{\sqrt{2\epsilon_S V_{bi}}}{\sqrt{qN}},$$

$$V_{bi} \triangleq \text{built-in voltage and } C_J = \frac{\sqrt{qN\epsilon_S}}{\sqrt{2V_{bi}}},$$

Junction capacitance $C_J$ the semiconductor device of FIG. 5A with no arsenic counterdoping, $C_{J\,No}$ and with As-counterdoping $C_{J\,As}$ can be defined by:

$$C_{J_{No}} = \frac{\sqrt{qN_A\epsilon_S}}{\sqrt{2V_{bi}}} = \frac{\sqrt{q\epsilon_S}}{\sqrt{2V_{bi}}} * (N_A)^{1/2} \, C_{J_{As}} =$$

$$\frac{\sqrt{qN_S\epsilon_S}}{\sqrt{2V_{bi}}} = \frac{\sqrt{q\epsilon_S}}{\sqrt{2V_{bi}}} * (N_S)^{1/2}$$

Since $N_A \gg N_S$, then the junction capacitance of the semiconductor device with As-counterdoping of FIG. 5B is much less than the junction capacitance of the semiconductor device of FIG. 5A with no arsenic counterdoping as represented by:

$$\rightarrow C_{J_{As}} \ll C_{J_{No}}$$

Figure 6:
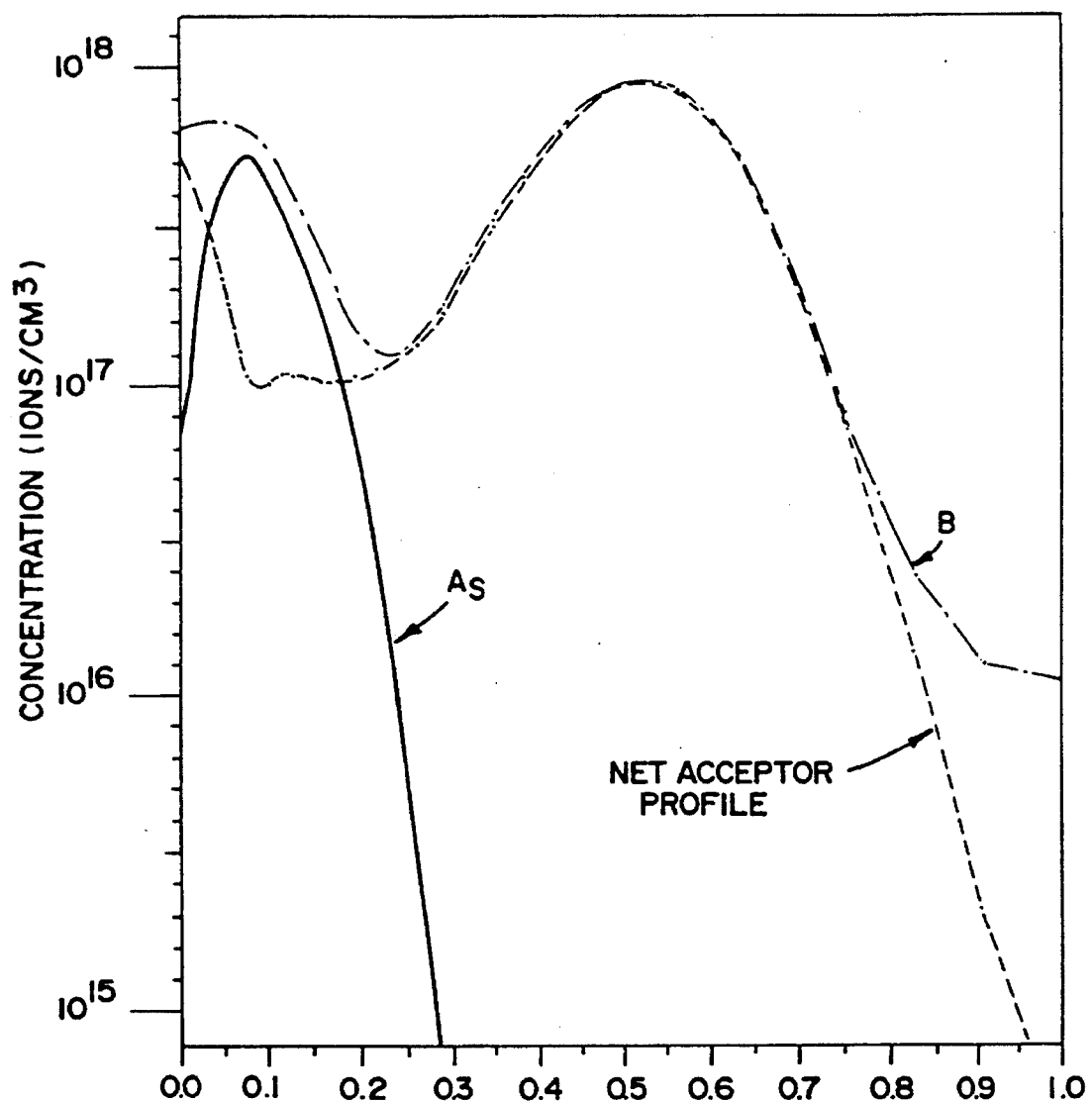
FIG. 6 is a chart illustrating a vertical doping profile for an N-channel semiconductor device of the present invention with arsenic counterdoping.

FIG. 6 illustrates a vertical doping profile for an example of an N-channel device used in peripheral circuitry for 256 Mega-bit DRAM. Processing parameters to fabricate an arsenic-counterdoped N-channel device illustrated in FIG. 6 with a 2.5 volt supply voltage, 82 Angstroms thick gate oxide is as follows. Four implantation steps are carried out with an implantation dose and at an implantation energy level of B:1.8E13 ions/cm²/10 Kev; B:2.5E13 ions/cm²/190 Kev; As:2.5E12 ions/cm²/140 Kev and As:3.6E12 ions/cm²/230 Kev, each at a implantation angle of 7 degrees. Heat cycles for the implantation process include gate oxidation for 15 minutes at 850° C. in dry oxygen, gate impurity drive-in of 40 minutes at 800° C., sidewall oxidation of 15 minutes at 800° C. and junction activation of 5 minutes at 880° C. followed by a rapid thermal annealing step for 10 seconds at 950° C. Obtained electrical parameters include a linear threshold voltage $V_T$ of 725 mv for a long channel device, a standby current $I_{OFF}$ below 80 pA with a minimum electrical channel length, $L_{MIN}$, of 0.20 microns, [VT($L_{EFF}$=1 um, $V_{DS}$=0.1 v)–$V_T$($L_{EFF}$=$L_{MIN}$, $V_{DS}$=2.5 v)] of 224 mv (where $L_{EFF}$ is electrical channel length of the device), a subthreshold slope for $L_{MIN}$ at $V_{DS}$=2.5 v at 25° C. of 78 mv/dec, a subthreshold slope for $L_{MIN}$ at $V_{DS}$=2.5 v at 85° C. of 97 mv/dec, a worst case substrate sensitivity at $L_{EFF}$=1.0 um of 260 mv, a substrate sensitivity at $L_{EFF}$=0.2 um of 140 mv and a maximum lateral electric field, $E_{MAX}$ of 5.5E5 v/cm for $L_{MIN}$ at $V_{DS}$=3.8 v, $V_{GS}$=3.8 v, at 140° C.

Figure 7:
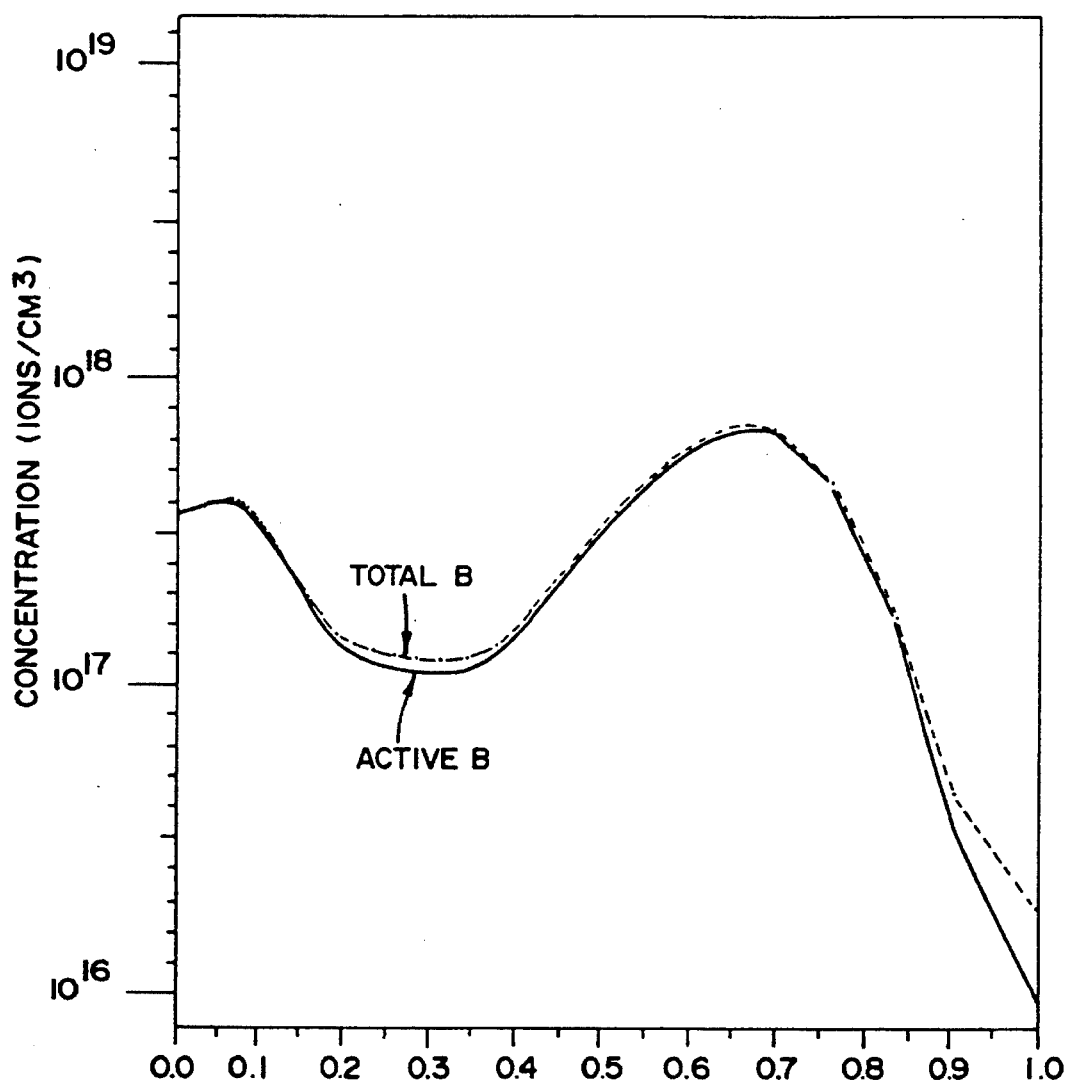
FIG. 7 is a chart illustrating a vertical doping profile for a semiconductor device without arsenic counterdoping.

FIG. 7 illustrates a vertical doping profile for n-channel MOSFET without As-counterdoping with two implantation steps carried out with an implantation dose and at an implantation energy level of B:1.0E13 ions/cm$^2$/10 Kev and B:2.0 E13 ions/cm$^2$/260 Kev.

Figure 8:
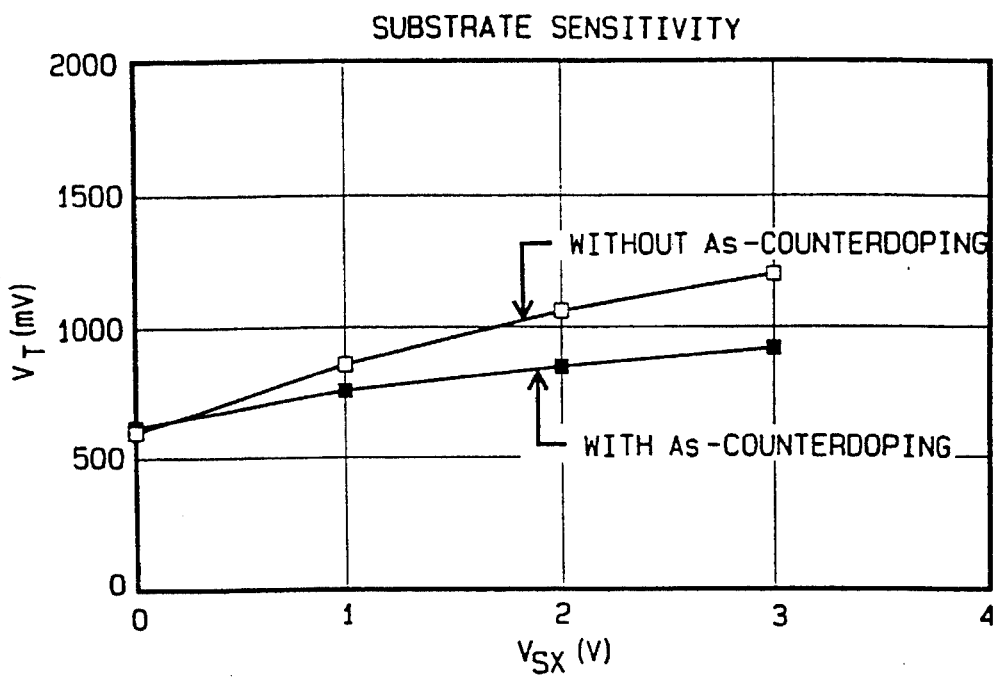
FIG. 8 is a chart illustrating substrate sensitivity for an N-channel semiconductor device without arsenic counterdoping and for an N-channel semiconductor device of the present invention with arsenic counterdoping.

FIG. 8 illustrates substrate sensitivity for an N-channel semiconductor device without arsenic counterdoping whose doping profile is depicted in FIG. 7, and also an N-channel semiconductor device with arsenic counterdoping whose doping profile is depicted in FIG. 6 for an effective channel length, $L_{EFF}$=0.2 um. In FIG. 8, threshold voltage $V_T$ is shown as a function of source to substrate voltage $V_{SX}$ for the device 10 by a curve labelled WITH As-COUNTERDOPING. It can be seen that the substrate sensitivity for device 10 is lower than the semiconductor device without arsenic counterdoping represented by curve labelled WITHOUT As-COUNTERDOPING.

Figure 9:
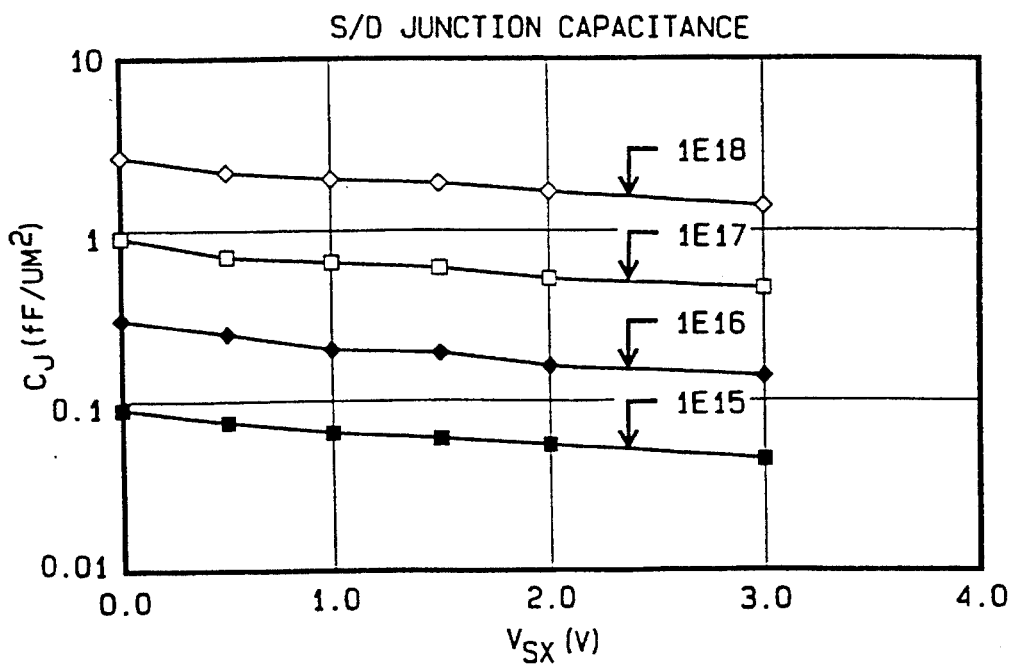
FIG. 9 is a chart illustrating source/drain junction capacitance as a function of Vsx for an N-channel semiconductor device for different substrate doping densities.

FIG. 9 is a chart illustrating junction capacitance as a function of source to substrate voltage $V_{SX}$ for the semiconductor device 10 with four curves labelled corresponding to substrate (p–) doping concentrations 1E18, 1E17, 1E16 and 1E15 atoms/cm$^3$.

Figure 10:
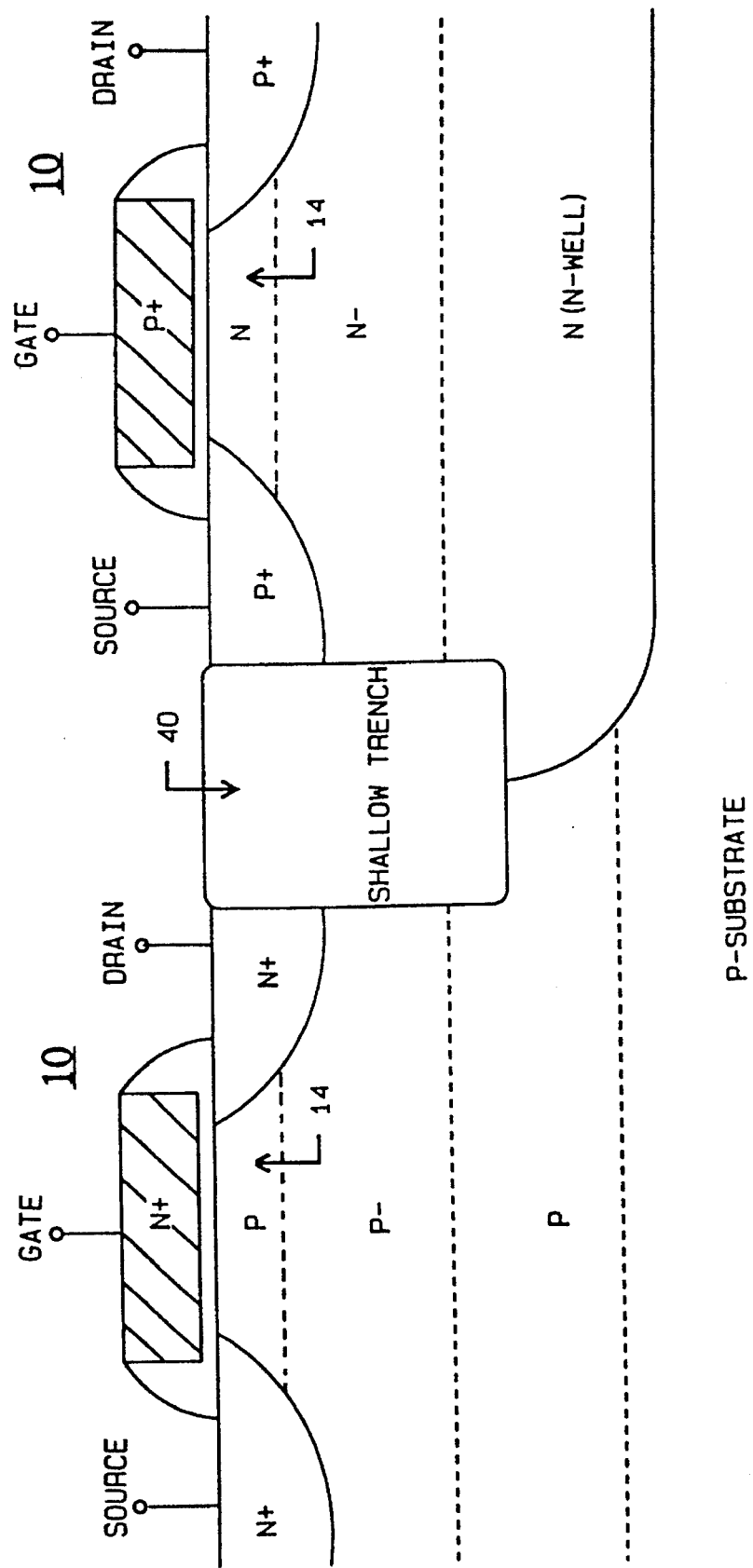
FIG. 10 is an enlarged side view of a portion of a complementary metal oxide semiconductor (CMOS) semiconductor device illustrating both an N-Channel device and a P-channel device in accordance with the present invention.

Referring to FIG. 10, there is shown a complementary metal oxide semiconductor (CMOS) semiconductor device with a oxide layer shallow trench 40 separating an N-Channel device 10 with the As compensated B p-region 14 and a P-channel device 10 with the B compensated As n region 14 in accordance with the present invention.

While the invention has been described with reference to details of the illustrated embodiments, these details are not intended to limit the scope of the invention as defined in the appended claims.

I claim:

1. A semiconductor device comprising:
   a substrate of first conductivity type;
   a gate oxide layer formed on said substrate carrying a polysilicon layer and a gate implant of opposite conductivity type of said substrate forming a gate;
   source and drain implants in said substrate of opposite conductivity type of said substrate forming a source and a drain;
   a threshold voltage ($V_T$) ion implant of said first conductivity type in said substrate between said source and drain implants below said gate;
   a second implant of opposite conductivity type of said substrate for counterdoping said threshold voltage ($V_T$) ion implant for reducing substrate sensitivity by forming an abrupt reduction in net acceptor density or net donor density from a shallow level to a deep level and forming at said deep level a substantially constant net acceptor density or a substantially constant net donor density as a function of depth X below said gate oxide layer.

2. A semiconductor device as recited in claim 1 wherein said threshold voltage $V_T$ ion implant is a boron implant and said gate, source and drain implants are arsenic implants defining an N-channel device.

3. A semiconductor device as recited in claim 2 wherein said second implant is an arsenic implant for counterdoping said boron implant and for reducing substrate sensitivity.

4. A semiconductor device as recited in claim 1 wherein said second implant reduces source and drain to substrate junction capacitance.

5. A semiconductor device as recited in claim 1 wherein said threshold voltage $V_T$ ion implant is an arsenic implant and said gate, source and drain implants are boron implants defining a P-channel device.

6. A semiconductor device as recited in claim 5 wherein said second implant is a boron implant for counterdoping said arsenic implant and for reducing substrate sensitivity.

7. A semiconductor device as recited in claim 2 wherein said boron implant has an implantation dose processing rate of 1.8E13 ions/cm$^2$ and 2.5E13 ions/cm$^2$.

8. A semiconductor device as recited in claim 7 wherein said boron implant has an implantation energy at 10 Kev and 190 Kev.

9. A semiconductor device as recited in claim 8 wherein said second implant is arsenic and has an implantation dose processing rate of 2.5E12 ions/cm$^2$ and 3.6E12 ions/cm$^2$.

10. A semiconductor device as recited in claim 9 wherein said arsenic implant has an implantation energy at 140 Kev and 230 Kev.

11. A semiconductor device as recited in claim 9 wherein said arsenic implant has a selected implantation energy level to compensate at a deep level of said threshold voltage ion implant.

12. An N-channel metal oxide semiconductor field effect transistor MOSFET device comprising:
    a substrate of first conductivity type;
    a gate oxide layer formed said substrate carrying a polysilicon layer and a gate implant of opposite conductivity type of said substrate forming a gate;
    source and drain implants in said substrate of opposite conductivity type of said substrate forming a source and a drain;
    a threshold voltage $V_T$ boron B implant of said first conductivity type in said substrate between said source and drain implants below said gate; and
    an arsenic As implant for counterdoping said threshold voltage $V_T$ ion implant for reducing substrate sensitivity by forming an abrupt reduction in net acceptor density or net donor density from a shallow level to a deep level and forming at said deep level a substantially constant net acceptor density as a function of depth X below said gate oxide layer.

13. A semiconductor device as recited in claim 12 wherein said boron implant has an implantation dose processing rate of 1.8E13 ions/cm$^2$ and 2.5E13 ions/cm$^2$ and an implantation energy at 10 Kev and 190 Kev.

14. A semiconductor device as recited in claim 13 wherein said arsenic implant has an implantation dose processing rate of at 2.5E12 ions/cm$^2$ and 3.6E12 ions/cm$^2$ and an implantation energy at 140 Kev and 230 Kev.

15. A P-channel metal oxide semiconductor field effect transistor MOSFET device comprising:
    a substrate of first conductivity type;

a gate oxide layer formed said substrate carrying a polysilicon layer and a gate implant of opposite conductivity type of said substrate forming a gate;

source and drain implants in said substrate of opposite conductivity type of said substrate forming a source and a drain;

a threshold voltage $V_T$ arsenic (As) implant of said first conductivity type in said substrate between said source and drain implants below said gate; and a boron (B) implant for counterdoping said threshold voltage ($V_T$) ion implant for reducing substrate sensitivity by forming an abrupt reduction in net acceptor density or net donor density from a shallow level to a deep level and forming at said deep level a substantially constant net donor density as a function of depth X below said gate oxide layer.

* * * * *